United States Patent [19]

Sabin

[11] Patent Number: 4,783,624
[45] Date of Patent: Nov. 8, 1988

[54] CONTACT PROBE DEVICES AND METHOD

[75] Inventor: Eugene R. Sabin, Prairie Village, Kans.

[73] Assignee: Interconnect Devices, Inc., Kansas City, Kans.

[21] Appl. No.: 851,783

[22] Filed: Apr. 14, 1986

[51] Int. Cl.$^4$ ............... G01R 1/073; G01R 1/067
[52] U.S. Cl. ............... 324/158 P; 324/72.5; 324/158 F
[58] Field of Search ............ 324/72.5, 73 PC, 149, 324/158 F, 158 P; 339/108 TP; 29/837

[56] References Cited

U.S. PATENT DOCUMENTS

| | | | |
|---|---|---|---|
| 1,651,314 | 11/1927 | Beasley, Jr. | 200/277 |
| 1,831,372 | 11/1931 | Spangler | 324/51 |
| 2,515,004 | 7/1950 | Haupt | 200/51 |
| 2,773,964 | 12/1956 | Majkrzak | 200/166 |
| 2,885,648 | 5/1959 | King | 200/51 |
| 3,315,163 | 4/1967 | Lutz | 324/149 |
| 3,412,327 | 11/1968 | Murray | 324/72.5 |
| 3,435,168 | 3/1969 | Cooney | 200/166 |
| 3,562,643 | 2/1971 | Smith | 324/72.5 |
| 3,676,776 | 7/1972 | Bauer et al. | 324/158 P X |
| 3,753,103 | 8/1973 | Tetreault et al. | 324/72.5 |
| 3,812,312 | 5/1974 | Andersen et al. | 200/61.53 |
| 4,050,762 | 9/1977 | Hines et al. | 339/108 TP |
| 4,200,351 | 4/1980 | Long et al. | 339/108 TP |
| 4,321,532 | 3/1982 | Luna | 324/73 PC X |
| 4,352,061 | 9/1982 | Matrone | 324/73 PC X |
| 4,504,780 | 3/1985 | Marsella | 324/158 P X |
| 4,659,987 | 4/1987 | Coe et al. | 324/72.5 X |

FOREIGN PATENT DOCUMENTS

| | | | |
|---|---|---|---|
| 36804 | 9/1981 | European Pat. Off. | 324/149 |
| 3240415 | 5/1984 | Fed. Rep. of Germany | 324/73 PC |
| 3340184 | 5/1985 | Fed. Rep. of Germany | 324/158 F |
| 2145582 | 3/1985 | United Kingdom | 324/158 P |
| 2146849 | 4/1985 | United Kingdom | 324/158 P |

OTHER PUBLICATIONS

"QA's New Ultra 50" Advertisement, Dec. 1985.

*Primary Examiner*—Reinhard J. Eisenzopf
*Assistant Examiner*—Stephen M. Baker
*Attorney, Agent, or Firm*—Wm. Bruce Day

[57] ABSTRACT

Electrical contact probes for use in providing electrical contact between diagnostic equipment and an electrical device to be tested are provided. The probes disclosed herein are particularly suitable for use where contact sites are spaced relatively close together. A structure is disclosed, usable for a plurality of probe designs, including two-component and three-component contact probes, which enables the probes to be mounted by a variety of methods. Generally, the methods of mounting disclosed are enabled by the positioning of a mounting flare on the contact probes. Also shown is a three-component contact probe design that is particularly suited for use in long stroke applications, wherein the contact probe generally comprises an outer cylinder member, an internally received barrel, and a movable probe member. This latter member includes a relatively narrow shaft portion which slidably engages the barrel member, within the cylinder member. The long stroke contact probe further includes a relatively wide head portion, wider than an internal portion of the barrel, but narrower than an internal portion of the cylinder member, providing extra width and strength to the probe member.

4 Claims, 2 Drawing Sheets

CONTACT PROBE DEVICES AND METHOD

BACKGROUND OF THE INVENTION

The present invention relates to electrical contact probes and in particular to spring-loaded contact probes developed for use in electrical testing for a variety of applications. Such probes are generally used to provide electrical contact between diagnostic or testing equipment and an electrical device to be tested.

Conventional spring-loaded contact probes generally include a receptacle, a plunger/probe member, and a spring-loaded barrel. In such devices, the plunger/probe member is mounted in the barrel and extends outwardly therefrom. The barrel includes spring means, so that the plunger/probe member is springably supported. That is, the probe member is biased outwardly a selected distance by the spring, and may be biased or depressed inwardly of the barrel, a selected distance, under force directed against the spring. The probe member is generally provided with a head or tip that may be used to contact electrical devices to be tested. Herein, such conventional contact probes are generally referred to as three-component probes, since they have a receptacle, barrel and probe member.

In conventional devices the barrel is mounted within the receptacle, with the plunger/probe member extending outwardly from the receptacle. Preferably, the barrel is removably mounted, so that should damage occur to the barrel or probe member, replacement is possible. Usually, the receptacle is permanently or semi-permanently mounted within a matrix for use within a testing facility. Electrical wiring may be attached to the receptacle, for electrical communication between the receptacle and the testing equipment or diagnostic equipment. Preferably, the probe member, barrel and receptacle, are manufactured from electrically conductive materials, so that an electrical circuit may be maintained between an electrical device to be tested, and diagnostic equipment, by means of the contact probe.

When such electrical probes are used, generally a contact side of the electrical equipment to be tested is brought into contact with the tip of the probe member, under pressure. Under the pressure, the probe member will generally bias inwardly of the barrel, against the spring, with the spring maintaining substantial pressure to the abutment of the probe member against the electrical device. This can be accomplished by the pressing of the electrical device against a stationary probe member, or by movement of the probe member against a stationary electrical device, or movement of both, as circumstances permit.

Often in conventional systems, a plurality of contact probes may be mounted within a single matrix. Generally, two methods may be used. In a first, a plurality of contact probes are mounted in a pattern suitable for use with a selected electrical device to be tested. In a second, generally, a plurality of probes are mounted in a pattern of columns and rows, with the probes located at positions evenly spaced, for example every 0.050 inches, along the rows and columns. Each of the probes for such an arrangement is connected to the diagnostic equipment.

With the latter type of system, generally an interface is used between the array of probes and the electrical device to be tested. Such an interface generally comprises probes mounted in a pattern appropriate for the particular electrical device to be tested. That is, the electrical device will be contacted by probes of the interface, which then only contact selected probes in the matrix. Thus, if it is desired to use the same matrix for testing different devices, only the interface need be changed. In this manner, it is not necessary to wire a separate matrix to the diagnostic equipment, for each type of device to be tested.

Recently, a general problem in developing testing equipment has been in the construction of probes for use with electrical devices, having a plurality of contact points or sites to be contacted by the probes, in which the contact sites are separated from one another by only a small distance. In particular, when contact points on an electrical device are located only about 0.020 inches apart, or less, conventional contact probes have posed problems. Generally, the problems have arisen from the fact that conventional receptacle, barrel and plunger/probe assemblies, have required sufficient overall width to make spacing of probes only 0.020 inches apart quite difficult, particularly when a large number of probes are involved.

In the past, several approaches have been taken, in attempts to solve this problem. One of these has been the development of devices often referred to as "buckle beams", and a second has been the development of a two-component contact probe.

A buckle beam generally comprises a very thin, somewhat rigid, electrically conducting contact mounted upon the end of a wire. When the buckle beam is brought into contact with a device to be tested, the beam bends or buckles somewhat, giving a spring-like effect. A plurality of buckle beams may be mounted within a holder or matrix, for use in testing electrical equipment.

Generally, buckle beams have been an unsatisfactory solution. First, as the buckle beam buckles or bends it takes up a lateral width and there is some risk of contact with one of the neighboring probes. Also, such devices may be relatively difficult to mount, and once mounted may be relatively difficult to change should damage occur to the buckle beam. Further, the buckling or bending does not, generally, provide a very great spring force, so the electrical contact is not very secure. Also, such devices may not maintain their proper spacing during use, and the tip of the probe may become displaced from its proper position.

Two-component spring-loaded contact probes have been developed by Interconnect Devices, Inc., the assignee of the present invention, as a partial solution to the problem of a contact probe, for use with contact sites or centers to be tested that were spaced a very small distance, for example, 0.020 inches, apart. With such probes, the extra width required by a receptacle and barrel arrangement is generally avoided. Such probes generally include a cylinder member, springably receiving a plunger/probe member, with a tip of the probe member extending outwardly from the cylinder member. The cylinder member is generally directly connected to diagnostic equipment, by means of an electrical wire or the like. Thus, the extra width added by the receptacle and barrel arrangement is avoided, and the probes may be positioned in a matrix arrangement with relatively close spacing. Further, a wider plunger/probe member may be enabled by the relatively small overall diameter of the probe. Thus, with such devices, the plunger/probe member may be wider and longer and will be less likely to bend during use.

An initial problem with such two-component contact probes has been in their mounting. Generally, the receptacle of a conventional three-component probe is mounted within a mounting matrix by means of a friction ring or retaining ring located on an outer surface of the receptacle. A relatively permanent mounting is permissible under such circumstances, as the barrel and probe member are usually constructed to be replaceable in a mounted receptacle, when necessary.

However, with two-component contact probes, if the cylinder member were permanently or semi-permanently mounted in the matrix, the plunger/probe member could not be readily changed when necessary. Thus, a means of mounting was necessary which would permit the two-component contact probe to be easily mounted and dismounted within a matrix or holder mechanism. Further, a general method of mounting comparatively small probes, relatively easily, has been needed.

Conventional two- and three-component contact probes generally have elongate, cylindrical, outer surfaces. Such a surface, especially when as small as might be used in small spring-loaded contact probes, has not provided for ready engagement by a holder mechanism, except by means of a resistance ring or friction ring, as described above. Due to the very small size of such probes, generally the mounting of handles or the like, for engagement by some portion of a holder mechanism, is not practical. Further, some matrices, or holder mechanisms, may include thousands of probes. It will be readily seen that the holder mechanism must be relatively simple to engage, and secure in operation, in order to be practical and desirable under such circumstances.

A related problem not sufficiently addressed by prior contact probes, has been the problem of a design of a contact probe for use under circumstances where a relatively long stroke for the plunger/probe member is required. That is, when, in use, the probe member may be expected to bias a relatively great distance into the barrel or cylinder member, or when the probe member needs to be particularly long. This has been a special problem in three-component contact probes. That is, for such probes the width or lateral distance taken up by the barrel width and receptacle width has generally necessitated a relatively narrow or thin probe member. If a probe member is to be biased over a relatively great distance, against a spring, the probe member needs to be relatively wide and strong. On one hand, if the probe member is wide, the barrel and receptacle, in order to accommodate the width of the plunger/probe member, in the past have also needed to be relatively wide, thus requiring a relatively great distance between sites to be contacted. On the other hand, if the probe member is made relatively thin, the plunger/probe member may not be strong enough to resist bending or buckling during use.

OBJECTS OF THE INVENTION

Therefore, the objects of the present invention are: to provide a two-component spring-loaded contact probe especially suited for mounting in cooperation with testing equipment to be used to test contact sites spaced relatively closely together in an electrical device to be tested; to provide such a two-component contact probe having a spring-loaded probe member; to provide such a two-component spring-loaded contact probe having means permitting mounting in a holder mechanism to be used with testing equipment; to provide methods of mounting a two-component spring-loaded contact probe in a holder mechanism; to provide such a two-component spring-loaded contact probe characterized by having an outwardly extending mounting flare thereon for engagement by a holder mechanism during mounting; to provide a method of mounting a two-component spring-loaded contact probe having a flare thereon, wherein the method of mounting comprises extension of the probe through three longitudinally aligned plates, with an offsetting of a central plate causing longitudinal pressure to hold the probe in place; to provide a method of mounting a two-component spring-loaded contact probe having a flare thereon, comprising the clamping of the flare between a cap member and a portion of the holder mechanism; to provide a contact probe having an outwardly extending flare thereon for use in mounting such a probe in a holder mechanism; to provide a method of mounting a contact probe, having a flare thereon, in a holder mechanism which utilizes lateral pressure applied to the probe, to retain same in the holder mechanism; to provide a method of mounting a contact probe, having an outwardly extending flare thereon, comprising a trapping of the mounting flare between a cap member and a portion of the holder mechanism; to provide a contact probe adapted for mounting in a holder mechanism by means of a variety of methods; to provide a three-component spring-loaded contact probe especially suited for use in long stroke applications; to provide such a three-component spring-loaded contact probe having a barrel completely received within a cylindrical member and having a plunger/probe member mounted in a chamber in the barrel, the plunger/probe member being characterized by having a shaft of one diameter and a head portion of a larger diameter than the shaft portion and the barrel chamber; to provide such a three-component spring-loaded contact probe with a mounting flare thereon, for use in mounting said contact probe in a holder mechanism; to provide a plurality of methods of mounting such a three-component contact probe; to provide spring-loaded contact probes which are relatively inexpensive to produce, which are relatively easy to manufacture and simple to use, and which are particularly well adapted for the proposed usages thereof; and to provide methods of mounting such spring-loaded contact probes which are relatively easy to effect and which permit a given contact probe to be mounted in a variety of different manners.

Other objects and advantages of this invention will become apparent from the following descriptions taken in conjunction with the accompanying drawings, wherein are set forth, by way of illustration and example, certain embodiments of this invention.

SUMMARY OF THE INVENTION

In a first embodiment of the present invention, a two-component spring-loaded contact probe is provided for use in creating electrical contact between testing equipment and an electrical device to be tested. The probe is constructed with means providing for a mounting of the two-component contact probe within a holder mechanism. A plurality of methods of mounting such a two-component contact probe is provided.

In a further embodiment of the present invention, an analogous method of mounting a three-component contact probe is provided. Also, a particular, preferred, three-component contact probe, for use in certain applications, is provided.

Initially, a general description applicable to both the two-component contact probe and three-component contact probe, and, in fact, contact probes generally, is presented:

Generally, an electrical contact probe, of the spring-loaded type, may be characterized as including an elongate cylinder member having a longitudinal inner channel, an open first end, a second end, and an outer surface. According to the invention, a retainer collar or mounting flare is mounted upon the cylinder member outer surface, preferably at the cylinder member first end, extending generally outwardly from the cylinder outer surface. The mounting flare provides the means by which the contact probe may be mounted, by application of a variety of methods, in a holder mechanism.

A spring-loaded contact probe is further characterized by having a probe mechanism associated therewith. Generally, the probe mechanism includes a plunger/probe member, or probe member, and spring means. The probe member is springably mounted within the cylinder longitudinal channel, to extend outwardly therefrom, with a tip of the probe member projecting outwardly from the cylinder member first end. This tip of the probe member, during use of the probe, is brought into contact with a site of interest in an electrical device to be tested.

As indicated above, the probe mechanism includes spring means therein, and the probe member is springably mounted. That is, as the tip of the probe member is brought into contact with an electrical device to be tested, the probe member may bias inwardly of the longitudinal channel in the cylinder member. Preferably, the probe member is provided with means permitting the probe member to extend outwardly from the cylinder member only up to a maximum, selected, distance, and further permitting biasing of the probe member into the cylinder member only up to a selected, preferred, distance. The spring force of the probe member generally assists in ensuring a good electrical contact.

Generally, contact probes include electrical connection means for electrical connection of the cylinder member to testing or diagnostic equipment. Preferably, this is provided by means enabling the mounting of an electrical wire to a second end of the cylinder member, and attachment of same to diagnostic or testing equipment. It will be understood that a variety of means of attachment of wires, or the like, to the cylinder member can be used.

For operation of the contact probe it is generally necessary to provide electrical circuit contact means between the tip or end of the probe member and the electrical connection means. Generally, this merely requires that the appropriate components of the probe be manufactured from sufficiently electrically conductive materials so that a preferred current can pass therethrough.

The presence of the mounting flare permits a variety of methods of mounting the contact probe to employed. In particular, three general methods of mounting are presented herein:

In a first, a holder mechanism for the contact probe includes first and second endplates, and a central plate. The plates are preferably mounted in the holder mechanism such that they are generally parallel to one another, with the central plate being laterally movable relative to the two endplates. The central plate, or locking plate, is used according the method to provide lateral pressure against the cylindrical member, retaining the probe within the holder mechanism.

According to the first method, the endplates and central plate are provided with a mounting channel extending therethrough. Generally, the mounting channel comprises a set of bores co-axially aligned, with the set of bores comprising a first bore in the first endplate, a second bore in the central plate, and a third bore in the second endplate. By "co-axially aligned" it is meant that the bores are aligned to define the longitudinal channel, at least when the central plate is positioned in a first, probe-insertion position, and, centers of the bores are substantially co-linear. Preferably, as will be understood from the detailed description, the bore in the first endplate, while larger than the cylinder member, is smaller than the flare, so that the flare cannot pass therethrough.

According to this first method, when it is desired to mount a contact probe having a flare thereon in the holder mechanism, the cylinder member second end is first inserted through a bore in the first endplate, then through the corresponding bore in the central plate, and then through the corresponding bore in the second endplate, with the insertion continuing until the flare is pressed against the first endplate in an area immediately adjacent the first endplate bore. Preferably, the bores will have been sized to relatively snugly receive the cylinder member therein.

A next step of this first method generally involves the positioning of the central plate, by lateral movement, to move the central plate bore slightly out of co-axial alignment with the first and second endplates. It will be understood that this generally places lateral pressure against the cylinder member, sometimes even slightly bending same out of linearity. This lateral pressure is used to maintain the contact probe within the holder mechanism. Generally, when this method of mounting is utilized, the mounting flare provides a head which holds the first end of the cylinder member in position during the bending or lateral movement of the central plate.

A second method of mounting a contact probe having a mounting flare thereon, requires the provision of a holder mechanism having a first endplate and a cap member. In a preferred embodiment shown, the holder mechanism also includes a second, rear endplate. The first and second endplates generally have bores therein defining a longitudinal probe-mounting channel. Preferably, the bores are again aligned generally co-axially. Also, preferably, the bore in the first endplate, while larger than the cylinder member, is smaller in diameter than the flare, so that the flare cannot pass therethrough. During application of the second method, the probe is inserted, by means of the cylinder second end, through the first endplate and then through the second endplate, until the flare abuts a portion of the first endplate immediately adjacent the first endplate bore. The cap member is then positioned in the holder mechanism to pinch or press the flare against the first retainer plate.

The preferred cap member is provided with an aperture therein through which the probe member may extend, but which is smaller in diameter than the flare, for pressing same into a secure position. It will be understood that the cap member of the holder mechanism for use in this second method may either be completely removable from the holder mechanism, during insertion of the probe, or may be constructed to merely be selectively positionable out of the way of the insertion.

According to a third method of mounting a contact probe having a flare thereon, the probe is pressed between a cap member generally analogous to that described for use in the second method outlined above, and a second endplate which is positioned abutting a second end of the cylinder member.

It will be readily understood that any of the three methods outlined above may be utilized in connection with a holder mechanism for the mounting of a plurality of contact probes. That is, the methods may be employed when more than one contact probe is to be mounted in the holder mechanism. Indeed, the methods may be applied when even thousands of probes are to be mounted.

Herein are presented a two-component and a three-component contact probe, both of which are adaptable for use with a mounting flare for use in mounting according to the methods outlined above. The two-component contact probe is, generally, as follows:

The two-component contact probe generally comprises an elongate cylinder member having an internal longitudinal channel extending therethrough. The cylinder member has a first end, a second end, an outer cylindrical surface, and an inner cylindrical surface. The outer cylindrical surface has the mounting flare thereon, which, in the preferred embodiment, surrounds the first end of the cylinder member.

The inner cylindrical surface includes a pair of abutments or detents therein. A spring is positioned between the pair of detents for use, as will be understood from the detailed description, in springably supporting a probe member within the probe. Preferably, the probe member of the two-component probe comprises an elongate spear-like member having a first end with a probe tip thereon, and a second end with a foot thereon. The probe member is mounted within the cylinder member so that the probe member first end extends outwardly from the cylinder member first end. The foot member is preferably sized to be pressed between the spring and a forward one of the above abutment members on the cylinder inner surface. Thus, the probe member is slidably and springably supported within the probe. If the tip or first end of the probe member is depressed toward the cylinder member, the probe member is biased into the cylinder member, as would be the case during contact of the probe within an electrical device to be tested.

Preferably, means of electrical attachment of the two-component contact probe to diagostic or testing equipment is provided. A preferred method of accomplishing this is through provision of means for insertion of a wire into a second end of the cylinder member, and retention therein, to maintain engagement between the probe and the wire. However, a variety of means of attachment of a wire to a contact probe, to provide electrical connection, may be utilized.

A three-component contact probe, especially designed for use when a relatively long stroke length or length of actuation of the spring for biasing is preferred, is presented. The probe also may be used to provide a particularly long probe member length, where needed. This three-component contact probe generally includes: a cylindrical member, a barrel with spring means therein, and a probe member. The cylindrical member has an elongate longitudinal bore preferably extending completely therethrough, and includes an inner cylindrical wall, an outer cylindrical wall, a first end and a second end.

The barrel, spring means and probe member of the three-component system generally comprise the probe mechanism referred to in the general description above. In the new three-component probe described herein, the barrel is preferably sized to be completely received within the cylinder member, with no portion of the barrel extending outwardly therefrom, and with a substantial portion of the cylinder member inner wall extending between an end of the barrel and the cylinder member first end. The probe member is preferably springably mounted within a longitudinal channel in the barrel, to extend outwardly therefrom and outwardly from a first end of the cylinder member. Preferably, the probe member includes a shaft portion, a head portion, and a foot portion. The foot portion is used to mount the probe member, slidably, within the spring-loaded barrel. The shaft portion is sufficiently small in diameter to permit slidable extension out of the barrel. The head portion is larger in diameter than the shaft portion, and, generally, is larger in diameter than the longitudinal channel in the barrel. Preferably, the head portion is nearly as large in diameter as the cylinder longitudinal channel. When the probe is fully assembled, the probe member head portion extends partly into, and partly out of, the cylinder member first end.

By this construction, a three-component spring-loaded contact probe is provided which may be used when a relatively long and/or wide probe member is desired. This will be particularly preferred when a relatively long stroke distance is expected to be needed for the probe member, against the spring, in a three-component system.

A general advantage to many three-component systems is that the barrel and probe member may be changed, with a relatively permanently mounted cylinder member. Preferably, mounting means for mounting of the barrel within the cylinder member, as for example by means of a friction fit, are provided. When sufficient tension is placed on the probe member, pulling same outwardly from the cylinder member, the probe member and barrel will be completely removed from the cylinder member. By a reverse method, a new barrel and probe member can be mounted within the cylinder member.

It will be understood that a mounting flare may be positioned on the cylinder member of a three-component contact probe for use in mounting same, in a holder mechanism, according to methods analogous to those described above. However, such three-component contact probes, as those described herein, may also be mounted in a conventional manner in matrices, as for example by use of a resistance ring or friction ring on an outer surface of the cylinder member.

Mounting flares similar to those described herein may be used on a variety of otherwise conventional contact probes, for mounting same according to the methods presented herein. Further, during the lifetime of a single contact probe, the probe may be mounted by a variety of the methods.

The drawings constitute a part of this specification and include exemplary embodiments of the present invention and illustrate various objects and features thereof. It will be understood that relative material thicknesses may be shown exaggerated for clarity.

BRIEF DESCRIPTION OF THE DRAWINGS

FIG. 3 being generally taken along line 3—3 of FIG. 1.

FIG. 4 being generally analogous to FIG. 3.

FIG. 5 being generally analogous to FIG. 3.

DETAILED DESCRIPTION OF THE PREFERRED EMBODIMENT

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but rather merely as a basis for the claims and as a representative basis for teaching one skilled in the art to variously employ the present invention in virtually any appropriately detailed structure.

The present invention relates to electrical contact probes and methods of mounting same within holder mechanisms used with testing equipment. In general, methods are provided which may be used with a variety of types of probes, including two-component electrical contact probes and three-component electrical contact probes. Further, certain preferred embodiments of two-component and three-component electrical contact probes are provided. The particular three-component electrical contact probe described is particularly versatile as it may be used with or without the structure disclosed for application of the disclosed methods of mounting.

Figure 1:
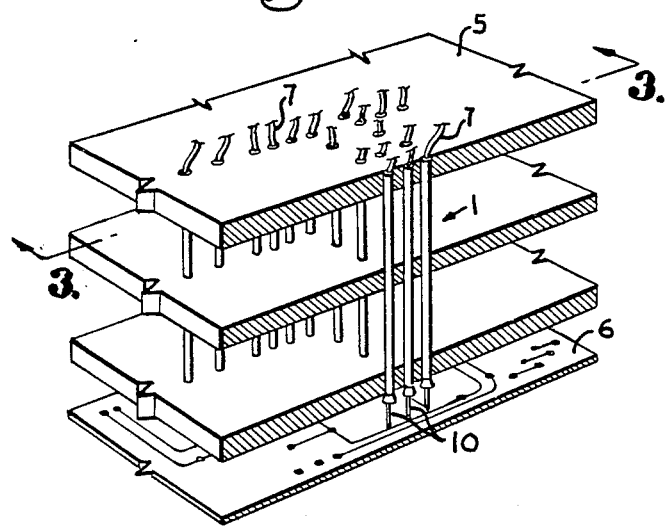
FIG. 1 is a fragmentary, perspective view of a plurality of spring-loaded contact probes mounted in a holder mechanism, according to the present invention, shown with probes contacting an electrical device to be tested.
Figure 2:
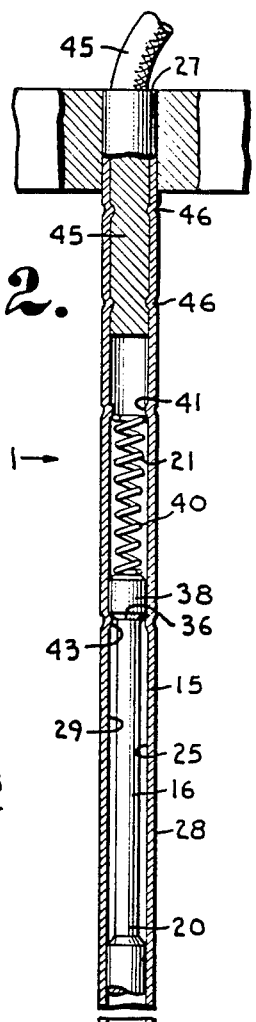
FIG. 2 is an enlarged, fragmentary, side elevational view of a two-component electrical contact probe having a mounting flare, according to the present invention, and with portions broken away to show internal detail.

Initially, a two-component electrical contact probe and methods of mounting will be generally described:

The reference numeral 1, FIGS. 1 and 2, generally refers to a two-component electrical contact probe according to the present invention. By the term "two-component" it is generally meant that the probe comprises a cylinder member and probe member without the presence of a barrel-type structure, such as that described in the summary above, or described below, for use in three-component contact probes.

Referring to FIG. 1, a plurality of probes 1 are shown mounted within a holder mechanism 5 for use in testing an electrical device 6. Generally, each probe 1 is attached by means of wires 7 to diagnostic or testing equipment, not shown. During testing of the device 6, ends 10 of selected probes 1 are brought into contact with selected sites on the device 6, to provide an electrical circuit through the probe 1. The testing or diagnostic equipment, not shown, may then be operated to test the device 6. For modern electrical devices, it may be necessary to test sites located very close to one another, for example spaced about 0.020 inches apart. It is for such testing that two-component electrical contact probes were particularly designed, as the design is particularly adaptable for use with very small devices. This, in part, stems from the fact that the two-component probe may have a relatively small width, permitting the ends 10 to contact sites very close together.

Referring to FIG. 2, the two-component electrical contact probe 1 depicted includes a cylinder member 15 and a probe mechanism 16. The probe mechanism 16 generally includes an elongate probe member 20 and spring means 21. Generally, the cylinder member 15 has an elongate longitudinal channel 25 therein which, in the preferred embodiment, extends completely therethrough and has a first end 26, a second end 27, an outer cylindrical surface 28, and an inner cylindrical surface 29. A retaining collar or mounting flare 30 is provided on the cylinder member first end 26. The flare 30 extends generally outwardly from the outer surface 28, and, in the preferred embodiment the flare 30 completely encircles the first end 26.

The mounting flare 30 is particularly important as it provides for applications of the methods of mounting according to the present invention.

In the preferred embodiment, the probe member 20 is generally spear-like and has a first end 35, a second end 36, a head or tip member 37 and a foot 38. The head 37 of the probe 1, depicted in FIG. 2, is shown coming to a point or tip, however it will be understood that a variety of shapes of heads 37 may be used.

Generally, the probe member 20 is smaller in diameter than the longitudinal channel 25 of the cylinder member 15. The probe member 20 is mounted within the longitudinal channel 25 to extend with the probe member first end 35 projecting outwardly from the first end 26 of the cylinder member 15. Preferably, the probe member 20 is slidably mounted and is springably supported within the probe 1 by means of a spring mounting system.

In the preferred embodiment, the spring means 21 comprises a coiled spring 40 extending between a rear abutment member or detent 41, on the inner cylindrical surface 29, and the probe member foot 38. The probe member foot 38 is preferably kept from being able to completely slide out of the cylinder member longitudinal channel 25 by means of a front abutment member, or detent, 43 on the inner cylindrical surface 29. Preferably, the spring 40 selected is appropriately sized to maintain pressure against the probe member 20 forcing same into the position shown in FIG. 2, with the foot 38 pressed against the front abutment member 43. However, when the probe 1 is pressed against the device 6 to be tested, the probe member 20 will bias against the spring 40, and generally retract, at least partially, further within the cylinder member 15. It will be understood that a variety of stroke lengths for the spring 40 may be provided.

The contact probe 1 depicted in FIG. 2 may be electrically connected to testing devices or diagnosing equipment by a variety of means. In FIG. 2 a wire 45 is shown inserted within the second end 27 of the cylinder member 15. The wire 45 is maintained therein by means of crimps 46. This provides an electrical connection means for electrical contact between the probe 1 and testing equipment. It will be understood that a variety of means may be utilized, however with probes as small as that contemplated for use with the design of FIG. 2, the crimping method may be preferred.

Generally, an electrical circuit contact means is needed to provide for electrical communication between the probe member tip 37 and the crimps 46 for the wire 45. Generally, this is provided by construction of the assembly 2 from components sufficiently electrically conductive to permit the desired transfer of current.

Two-component electrical contact probes, as depicted in FIG. 2, are particularly suited for use where electrical centers on a device 6, FIG. 1, to be tested, are positioned very close to one another. In particular, the probe may be adapted for use, for example, when such contact centers are positioned only 0.020 inches apart. For such a system it is envisioned that: the probe member would be constructed from a hardened steel; the spring from gold plated stainless steel; and the cylinder member from gold lined phosphor-bronze, although a variety of compositions for these components is feasible. It is further envisioned that, for a preferred embodiment, the entire length of the probe would be about 0.900 inches with the probe member 20 extending about 0.100 inches beyond the flare 30. A preferred diameter for the probe member 20, for use with centers positioned 0.020 inches apart, is approximately 0.011 inches. With such a probe member 20, a cylinder member having a diameter of about 0.015 inches may be used, with the flare having a maximum diameter of about 0.017 inches.

It will be understood that a very small spring 40 would be used with such a device. In the typical probe 1, a spring having a rated spring force of about 0.6 ounces over a stroke of about 0.043 inches may be used. Preferably, the probe member 20 is maintained under a pre-load force, on the spring, of about 0.4 ounces.

While the probe 1 may be constructed from a variety of materials, in a typical embodiment the construction will be of appropriate materials as to yield a current rating of about 0.500 amps and a contact resistance of about 300 milliohms maximum, for typical applications.

Figure 3:
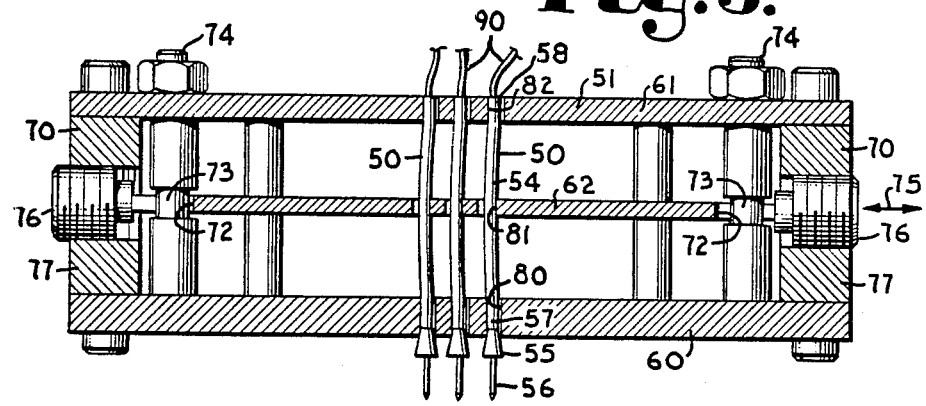
FIG. 3 comprises a fragmentary, side, cross-sectional, view of an assembly with a plurality of contact probes, having mounting flares according to the present invention, mounted within a holder mechanism according to a method of the present invention, and with portions broken away to show detail.

The presence of the mounting flare 30 on a contact probe such as probe 1, depicted in FIG. 2, permits a variety of methods of mounting in a holder mechanism 5 to be employed. A first method of mounting a probe having a flare is shown in FIG. 3. Referring to FIG. 3, probes 50 are shown mounted within a holder mechanism 51. Each of the probes 50 includes a cylinder member 54 and a flare 55 analogous to those described above for probe 1. It will be understood that the internal mechanism of the probes 50 does not necessarily dictate the nature of mounting shown in FIG. 3. Rather, it is generally only necessary that the probes 50 each have an outer cylinder member 54 and a flare 55, with a probe member 56 extending outwardly therefrom. Generally, the cylinder member has a first end 57 and a second end 58.

According to the method of mounting shown in FIG. 3 a holder mechanism 51 is provided, generally, as follows:

The holder mechanism 51 includes a first endplate 60, a second endplate 61 and a central plate 62. The first and second endplates 60 and 61 are preferably mounted to extend generally parallel to one another, with the central, or locking, plate 62 positioned therebetween. The central plate 62 is laterally movable relative to the endplates 60 and 61 as described below.

The endplates 60 and 61 are generally manufactured from nonelectrically conductive materials and are preferably mounted by means of a conventional bolt and spacer arrangements 70. Apertures 72 in the central plate 62, in coordination with narrow sections 73 of support bolts 74 permit central plate 62 to be movable laterally, or along the directions of double headed arrow 75. Screw members 76, threadably received within spacers 77, permit lateral adjustment of the position of central plate 62 and further provide locking means for retaining the central plate 62 in a preferred orientation.

A plurality of probe mounting or probe insertion channels are provided within the holder mechanism 51. Generally, each mounting channel comprises a set of bores extending through the plates 60, 61, and 62, with a set of bores comprising a first endplate bore 80, a central plate bore 81 and a second endplate bore 82. Preferably, as will be apparent from reference to FIG. 3 and the further detailed description, each of the bores 80, 81 and 82 is sized for receipt of the cylinder member 54 therethrough. Also, preferably, the bore 80 in the first endplate 60 is sized smaller than the flare 55 of a probe 50 to be mounted therein.

The bores 80, 81 and 82 are positioned, for any given set, so that co-axial alignment is possible. By "co-axial" alignment it is meant that the bores 80, 81 and 82 of any given set may be aligned with their centers co-axial or co-linear, so that a longitudinal mounting channel extends therethrough. This permits insertion of the elongate cylinder member 54 therethrough.

The holder mechanism of FIG. 3, and indeed the holder mechanisms of any of the alternate embodiments later described, may include further plate support features, and/or features for mounting in testing equipment or for convenient, automated, use. The holder mechanisms depicted in the drawings are generally shown without such features as they do not, generally, substantively concern the methods of mounting described herein. It will generally be understood, by those skilled in the art, that numerous variations in holder mechanisms may be used or adapted for use with holder mechanisms having features such as those described herein.

When the method of mounting depicted in FIG. 3 is to be practiced, generally the laterally movable central plate 62 is positioned in the holder mechanism 51 so that each set of bores 80, 81 and 82, which is to receive a probe 50, is aligned co-axially. The probe 50 is then inserted into the mounting channel defined by bores 80, 81 and 82 with the second end 58 of the cylinder member 54 inserted first through the bore 80 in the first endplate 60, and then through the bore 81 in the central plate 62 and finally through the bore 82 in the second endplate 61. The insertion is continued until the flare 55, of the probe 50 being mounted, abuts the first endplate 60, further inserting being prevented by the flare 55 being larger in diameter than the aperture 80.

In some applications it may be desired to mount a plurality of probes 50 in a single holder mechanism 51, as shown in FIG. 3. If this is the case, then the method outlined thus far is practiced on each probe 50 until the holder mechanism 51 is loaded with as many probes as desired, positioned where desired. At this point, the assembly is ready for the locking of the probes 50 in place. This is accomplished by adjusting the lateral position of the central plate 62, as shown in FIG. 3, so that central plate bores 81 are moved slightly out of co-axial alignment with endplate bores 80 and 82. That is, lateral pressure, by means of adjustment of the position of central plate 62, is placed against the cylinder member 54 of the probes 50. As shown in FIG. 3, this may bend the probes 50 somewhat, however it is generally observed that such bending is tolerable. Regardless of the extent of bending, generally the result of the lateral pressure applied by central locking plate 62 is that the probes 50 are securely held in position.

It will be understood that the flare 55 aids in this method of mounting probes in several manners:

For example, the flare 55 provides a stop against further insertion of the probe 50, so that all uniformly manufactured probes may be mounted in a uniform manner; that is, with the probe members 56 extending a fixed and selected distance beyond the first endplate 60. Further, as the probe members 50 are pressured during locking, by the central plate 62, a tension along the longitudinal axis of the probe may be set up, pulling against the flare 55 which provides an end stop. Again, this aids in secure mounting. Further, the flare 55 may aid in maintaining direction of extension of probe members 56, when the flare 55 is seated with the bore 80.

It will be understood that, if desired, a probe 50 mounted according to the method shown in FIG. 3 may be readily changed if necessary. This could be accomplished by the biasing of the central locking plate 62 back into general alignment of bore 81 with bores 80 and 82. The probe to be changed could then be removed and replaced.

In FIG. 3, wires 90 are shown extending outwardly from probes 50. These wires, analogous to wire 45 in FIG. 2, generally provide for electrical contact between the probes 50 and testing and/or diagnostic equipment, not shown. It will be understood that the wires 90 may have been attached to the probe members 50, prior to mounting, in which case the wires 90 would be threaded through the mounting channel, prior to insertion of the probe 50. Alternatively, it is foreseen that the wires 90 may be attached after probe insertion in some instances.

Figure 4:
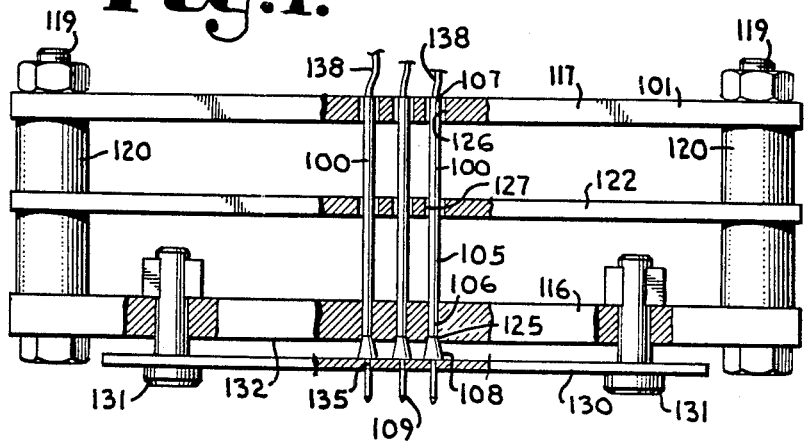
FIG. 4 is a fragmentary, side cross-sectional view showing a plurality of electrical contact probes, having mounting flares thereon, mounted within a holder mechanism by means of an alternate method of mounting according to the present invention.

The presence of a mounting flare generally provides for a second convenient method of mounting of probe members within a holder mechanism. Such an alternate method of mounting is shown in FIG. 4. In FIG. 4, a plurality of probes 100 is shown mounted within a holder mechanism 101. Each probe includes a cylinder member 105 having a first end 106, a second end 107 and a mounting flare 108. Also, each probe 100 is provided with a probe member 109. It will be understood that, as indicated above, the probes 100 may be otherwise of a variety of designs, for example they may be two-component probes or three-component probes as defined herein.

The holder mechanism 101 includes a first endplate 116 and a second endplate 117. The endplates 116 and 117 are mounted spaced apart from one another by means of bolts 119 and spacers 120. The particular holder mechanism depicted in FIG. 4 also includes a central plate 122 which, unlike plate 62 in FIG. 3, is not required to be laterally movable. Plate 122, as will be understood from reference to the drawing, generally aids in support of a central portion of the probes 100, for resisting lateral movement.

For each probe 100 to be mounted, the holder mechanism 101 includes a mounting channel. The mounting channel includes a set of bores, extending, as seen in FIG. 4, through the holder mechanism 101. In the preferred embodiment depicted, a set of bores includes a first endplate bore 125, a second endplate bore 126 and, since a central plate 122 is present, a central plate bore 127. The three bores 125, 126 and 127 are generally co-axially aligned. That is, a single line passes through the approximate center of each of the three bores 125, 126 and 127.

Bore 125 in the first endplate 116 is preferrably sized slightly larger than the cylinder member 105, but smaller than the flare 108, to prevent passage of the flare 108 therethrough. Bores 126 and 127 are preferably appropriately sized for receipt of the cylinder member 105 therethrough.

Holder mechanism 101, of the preferred embodiment for application of the second method of mounting, also includes a cap member 130 removably mounted thereon by means of bolts 131, or the like. While, in the preferred embodiment, cap member 130 is shown removably mounted in the holder mechanism 101, it will be understood that it is generally only required that the cap member 130 be mounted in such a way that it can be moved out of the way of access to the first endplate bore 125 for mounting of probes 100, and then secondly be movable into a position for locking of the probes 100 into place. The second position will generally be referred to as a locking position for the cap member 130. In FIG. 4, the cap member 130 is shown in the locking position.

Also, for the embodiment depicted in FIG. 4, the cap member 130 is shown mounted on a side 132 of the first endplate 116 which faces generally away from the second endplate 117. In the locking position shown in FIG. 4, the cap member 130 is spaced apart from the side 132 of the first endplate 116 a distance approximately equal to the length of the mounting flares 108 in probes 100 to be mounted.

For each mounting channel in the holder mechanism 101, in which a probe 100 is to be mounted, the cap member 130 includes a probe mounting aperture 135. Each probe mounting aperture 135 is sized large enough to permit the probe member 109 to extend therethrough, but is smaller in diameter than the mounting flare 108. The probe mounting aperture 135 for any given mounting channel is generally co-axially aligned with a set of bores defining that channel. This, it will be readily seen from FIG. 4, accommodates mounting of the probe 100 within the channel.

Referring to FIG. 4, it will readily be understood that the method of mounting depicted herein generally comprises the utilization of the cap member 130 to trap the flare 108 against the side 132 of the first endplate 116. Generally, according to the method, the holder mechanism 101 is prepared for the mounting of the probes 100 by removal of the cap member 130 from blockage of access to the mounting channel defined by bores 125, 126 and 127. Again, for the embodiment depicted in FIG. 4, this generally comprises the dismounting of the cap member 130 by means of bolts 131.

When the holder mechanism 101 is thus prepared, the probe 100 to be mounted is inserted within the mounting channel. Generally, this is accomplished by insertion of he cylinder member second end 107 first through the first endplate bore 125 and lastly through the second endplate bore 126. Since the holder mechanism 101 depicted in FIG. 4 includes a central plate 122, as the cylinder member second end 107 is moved toward the second endplate 117, it will pass through the central plate bore 127. Insertion of the probe cylinder member 105 will usually continue until the flare 108 is seated against the first endplate face 132. At this point, the cap member 130 is remounted in the holder mechanism 101, with passage of the probe member 109 through the mounting aperture 135. Thus, the cap member 135 becomes a portion of a clamp trapping the flare 108, of a probe being mounted, against the first endplate 116.

By reference to FIG. 4, it will be readily understood that a plurality of probes 100 can be mounted according to the method, with the provision of an appropriate set of spaced mounting channels in the holder mechanism and matching apertures in the cap member. Generally, each probe would be mounted as described above.

In FIG. 4 wires 138 are shown extending out of the second ends 107 of the cylinder members 105. The wires 138 generally provide for electrical communication between the probes 100 and diagnostic or testing equipment, not shown. As with the method of mounting shown in FIG. 3, for the method depicted in FIG. 4, if the wires 138 are attached to the probes 100 prior to mounting, then the wire for any given probe would usually first be threaded through the longitudinal channel, before the probe 100 is inserted therein. On the other hand, it is conceivable that the wires 138 could be mounted on the probes 100, after the probes have been mounted in the holder mechanism 101.

In FIG. 4, the second ends 107 of the mounted probes 100 are shown extending generally completely through the bores 126 in the second endplate 117. This may aid in providing lateral support for the probes 100; however it is generally the action of the cap member 130 on the flares 108 which provides for locking of the probes 100 in position. As indicated above, further lateral support is provided by the central member 122, and it will be understood that a plurality of central members might be preferred under certain circumstances. Further, it is foreseen that a single plate having a relatively great thickness might be preferred, for some circumstances, with an elongate channel extending through the thick plate, which would act as the first endplate, and with the plate generally supporting the probe cylinder member 105 along substantially its entire length of extension.

Figure 5:
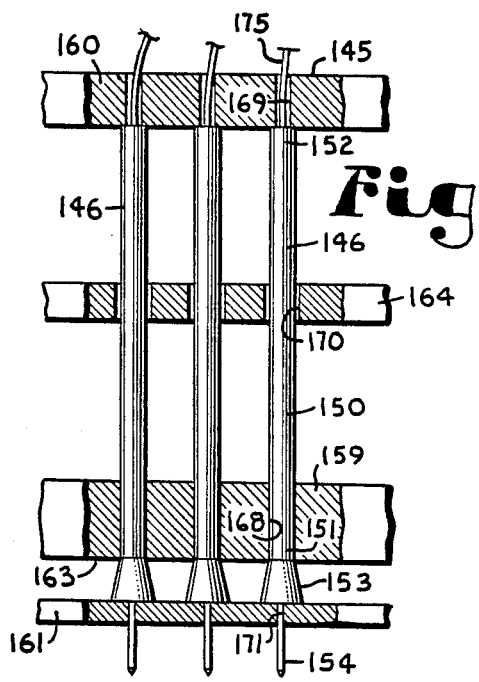
FIG. 5 comprises an enlarged, fragmentary, side cross-sectional, view of an assembly with a plurality of electrical contact probes mounted within a holder mechanism by means of a second alternate method of mounting electrical probes having mounting flares thereon, according to the present invention, with portions broken away to show detail.

A third method of mounting contact probes having mounting flares thereon is depicted in FIG. 5. FIG. 5 is a fragmentary view of a holder mechanism 145 supporting a plurality of probes 146 according to the second alternate method of mounting. Each probe 146 includes a cylinder member 150 having a first end 151, a second end 152 and a mounting flare 153. A spring-loaded probe member 154 extends outwardly from the first end 151 of the cylinder member 150.

It will be understood that the general construction of probe members 146 may vary somewhat, but still may be utilized with respect to the presently described method of mounting. In particular, two-component probes or three-component probes, as defined herein, may be utilized.

The holder mechanism 145 depicted in FIG. 5 includes a first endplate 159 and a second endplate 160. A cap member 161, generally analogous to cap member 130 depicted in FIG. 4, is mounted in a spaced apart relation with respect to a side 163 of the first endplate 159, the distance of spacing being generally equal to the length of the flare 153. The holder mechanism 145, of FIG. 5, includes a central plate 164 to provide lateral support of the probes 146.

Generally, analogously to holder mechanism 101 of FIG. 4, holder mechanism 145 of FIG. 5 includes a plurality of mounting channels therein. Each mounting channel is defined by a set of bores extending through the holder mechanism. In particular, the mounting channel is defined by first endplate bore 168, second endplate bore 169 and, due to the presence of the central plate 164, central plate bore 170. Generally, as described for the sets of bores defining mounting channels in holder mechanisms 51 and 101, the bores 168, 169, and 170, which define a mounting channel in holder mechanism 145, are substantially co-axially aligned. Further, cap member 161 includes a probe mounting aperture 171 for each mounting channel.

For the mounting method depicted in FIG. 5, the first endplate bore 168 is generally sized sufficiently large to receive the cylinder member 150 therethrough, but is smaller in diameter than the mounting flare 153. The central plate bore 170 is also sufficiently large to permit passage of the cylinder member 150 therethrough. On the other hand, the bore 169 in the second endplate 160 is too small for the passage of the cylinder member 158 therethrough. The endplate 160 is mounted spaced apart from first endplate 159 a distance generally equal to the length of the cylinder member 150 from its first end 151, upon which the flare 153 is mounted, to its second end 152.

When the method of mounting depicted in FIG. 5 is to be used, the holder mechanism 145 is prepared for mounting by adjustment of the cap member 161 to provide access to the mounting channel. The probe 146 is mounted in the mounting channel by insertion of the cylinder member first end 152 first through first endplate bore 168, and secondly through the central member bore 170, with insertion continuing until the cylinder member second end 152 abuts the second endplate 160. The cap member 161 is then placed in locking position, with the probe member 154 extending through the mounting aperture 161. When the cap member 161 is locked into position, it generally compresses, longitudinally, the probe 146 somewhat, securing the probe 146 in position. Generally, this compression is of two types. First, the flare 153 is pressed between the cap member 161 and the first endplate 159. Secondly, the entire probe 100 is pressed between the cap member 161 and the second endplate 160, against which the second end 152 of the cylinder member 150 abuts. It will be understood that in some arrangements it may be preferred to substantially only rely on pressure of the first type described, in order to retain the probe 146 in position. If this were the case, the spacing of the cap member 161 from the first plate 159 would be slightly greater than the effective length of the flare 153.

It will be understood, by reference to FIG. 5, that the second endplate 160 need not necessarily have the bore 169 therein. Rather, the bore 169 generally is for access to the cylinder member second end 152 by a wire 175. It is foreseen that a holder mechanism 145 could be utilized with the mounting method of FIG. 5, without bores 169 passing through the second endplate 160, if the probe 146 were alternately wired to testing and/or diagnostic equipment.

In general terms, the technology described relates to problems of mounting very small spring-loaded electrical contact probes for use in testing electrical equipment. As previously indicated, the development and mounting of such probes poses special problems when the centers to be tested or contacted are spaced only a very small distance from one another. A method of overcoming this problem has been the development of a two-component contact probe, mounted by means of a mounting flare, as previously described. In the past, generally three-component contact probes have been less desirable for use in situations wherein test sites to be contacted are very close together, as the width of the three-component probes generally have necessitated use only where the test centers are spaced substantially further apart. It has been indicated herein however, that, if desired, mounting flares may be used in association with three-component spring-loaded contact probes which are intended to be mounted by one of the three methods described.

A special problem is present when a particularly long stroke probe is needed, especially where testing centers are spaced relatively close together. Under such circumstances the overall width of the both the probe and the probe member must be relatively small. However, with conventional three-component probes, the width of the cylinder member and the barrel which is received therein generally necessitates a relatively narrow probe member. When a long stroke situation is presented, a relatively long and thin probe member may easily bend or wiggle out of alignment.

Figure 6:
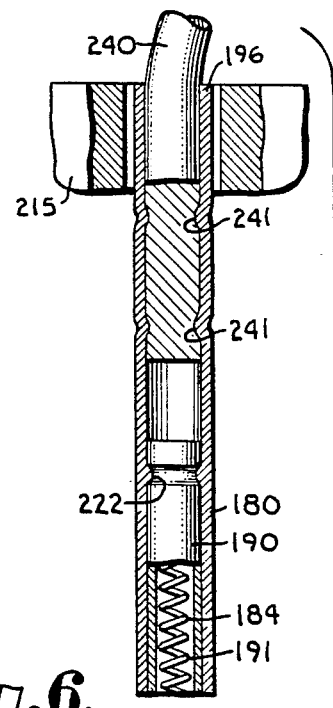
FIG. 6 is an enlarged, fragmentary, side view of a three-component electrical contact probe according to the present invention, with portions broken away to show internal detail.

A particularly desirable arrangement of three-component contact probes, for use in situations where a relatively long stroke is desired, is depicted in FIG. 6. Generally, the three-component probe 180 of FIG. 6 includes a cylinder member 181 and a probe mechanism 183. The probe mechanism 183 generally comprises spring means 184 and probe member 185. The spring means 184 of probe 180 comprises a barrel 190 having a spring 191 therein, which supports the probe member 185.

Probe 180 is referred to as a three-component probe for its utilization of an outer cylinder member 181, a separate barrel 190, which is received within the cylinder member 181, and a probe member 185. The probe member 185 is springably mounted wihtin the barrel 190, which is itself removably mounted within the cylinder 181. An advantage to the use of such a barrel 190 is that the spring 191 is less likely to be exposed to contamination.

In conventional three-component probes, generally the barrel, while mounted within a cylinder member, extends either partly outwardly therefrom, or up to near the end of the cylinder member. The probe member of such devices, which projects outwardly from a portion of the barrel and generally also extends outwardly from the cylinder member, must, in the past, have been of a relatively thin or narrow diameter, since it generally needs to be smaller in diameter than both the barrel and the cylinder member. Probe 180, disclosed in FIG. 6, differs from this construction significantly.

Cylinder member 181 includes a first end 195, a second end 196, an outer cylindrical surface 197 and an inner cylindrical surface 198. The inner surface 198 defines a longitudinal channel 199 extending generally through the cylinder member 181.

The barrel 190 is relatively short and is completely received within the cylinder member longitudinal channel 199. The cylinder member 181 includes a channel portion 200, which extends between the barrel 190 and the cylinder member first end 195. The barrel has an internal chamber 201 in which the spring 191 and a portion of the probe member 185 are received.

The probe member 185 includes a shaft portion 205, a head portion 206, having a contact point 207 thereon, and a foot portion 208. The foot portion 208 is received within the barrel 184 and is prevented from being released therefrom by abutment 210. The spring 191 is appropriately positioned to bias the foot 208 against the abutment 210 and thus retain the probe member 185 in an orientation with the head portion 206, and the contact point 207, projecting a selected, maximum, distance outwardly from the cylinder member 181. It will be readily understood that as the contact probe 180 is brought into contact with an electrical device to be tested, not shown, the contact point 207 is engaged, the probe member 185 is biased inwardly of the cylinder 181 and the barrel 190, and the spring 191 is compressed somewhat.

The shaft portion 205 of the probe member 185 is sufficiently small in diameter to permit extension outwardly from the abutment 210 in the barrel 190, so that the probe member 185 is slidably mounted within the probe 180. On the other hand, the head portion 206 of the probe member 185 is larger in diameter than the internal chamber 201 of the barrel 190, the barrel 190 terminating at end 211. Also, the head portion 206 is smaller in diameter than the internal chamber 199 of the cylinder member 181. Thus, when the probe member 185 projects outwardly from the first end 195 of the cylinder member 181, it is nearly as great in diameter as the longitudinal channel 199. In this manner a three-component contact probe having a probe member extending outwardly therefrom, which is relatively wide, is provided. The relatively wide head member, it will be readily understood, will generally resist bending or lateral biasing, and will be relatively strong and durable in use. Also, it is directed in its extension by riding on the inside of the cylinder member.

The probe member 185 shown in FIG. 6, includes a transition portion 212 in the head portion 206; the transition portion 212 being positioned between the shaft portion 205 and a widest part of the head portion 207. The transition portion 212 is nearly as large in diameter as the widest part of the head portion 206. The difference is, preferably, only on the order of 0.001 inch and is shown exaggerated. The transition portion 212 accommodates some narrowing of the receptacle or cylinder member 181 during mounting, by means of a resistance ring, as described below.

The three-component construction is particularly desirable when the probe 180 is intended to be mounted within a matrix 215 as shown in FIG. 6. For such mounting, cylinder member 181 includes a resistance ring or friction ring 218 on an outer surface thereof, which generally retains the cylinder member 181 within a bore 219 in the matrix 215, by means of a friction or resistance fit. Once the cylinder member 181 has been mounted, a barrel and probe member assembly may be slid into the first end 195 of the cylinder member longitudinal channel 199 and locked into place by means of friction engagement with detents 222. If the probe member and barrel assembly needs to be replaced, it may be pulled outwardly against the frictional retention of the detents 222. Thus, it may be readily changed. When the resistance ring 218 engages the bore 219, an area of the cylinder member 181 immediately adjacent the resistance ring 218 may be squeezed somewhat. The transition portion 212 in the probe member head portion 206, accommodates the slight squeezing.

Figure 7:
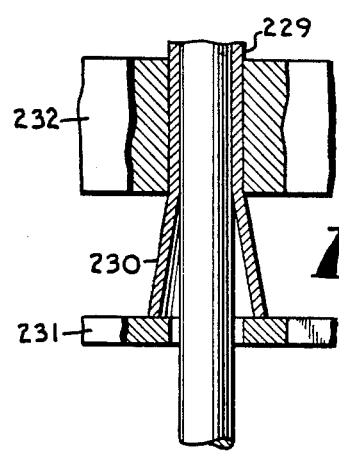
FIG. 7 is an enlarged, fragmentary, side view generally depicting a portion of a three-component electrical contact probe analogous to FIG. 6, but with a mounting flare thereon, and shown in cooperation with a portion of a holder mechanism for mounting; portions being broken away to show internal detail.

An alternate method of mounting a three-component probe, in particular one having an internally received barrel similar to that described, is depicted in FIG. 7. FIG. 7 generally shows a fragmentary view of a probe 229 having a construction similar to that shown in FIG. 6, except for the presence of a mounting flare 230. As shown in FIG. 7, the mounting flare 230 may be used in association with a cap member 231 for mounting within a holder mechanism 232 by methods previously described. It will be understood that if a mounting flare 230 is used, the probe member may be provided without a transition portion such as that described above.

Referring again to FIG. 6, wire 240 provides for electrical connection between the probe 180 and diagnostic and/or testing equipment, not shown. While a variety of methods of the mounting of wire 240 are shown, the wire in FIG. 6 is attached to the cylinder member 181 and secured by means of crimping at points 241. The wire may also be attached by soldering or similar methods.

Figure 8:
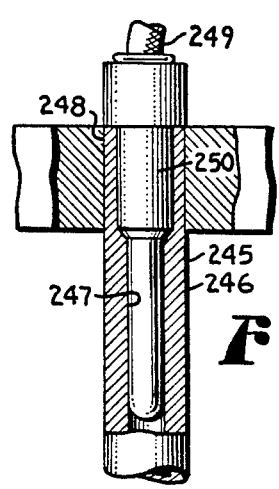
FIG. 8 comprises an enlarged, fragmentary view of a portion of a three-component electrical contact probe analogous to FIG. 6, but with an alternate form of electrical connector.

An alternate means of attachment of wire is shown in FIG. 8. In FIG. 8 the cylinder member 245 of a probe 246 is shown having a receiving socket 247 in the cylinder member second end 248. The wire 249 is shown attached to a plug 250, which is capable of mating with the cylinder member second end 248 for electrical connection.

Figure 9:
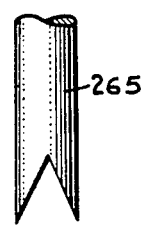
FIG. 9 is an enlarged, fragmentary view of a portion of an electrical contact probe; the view depicting an alternate embodiment to FIG. 6.

The probes depicted in FIGS. 1 through 6, inclusive, have all been shown with pointed tips on the ends of the probe members. It will be readily understood that a variety of tips might be preferred, for different situations. FIG. 9 shows an example of a tip 265 which might replace the conical pointed tips previously shown. From this it will be readily understood that a wide variety of tips might be preferred for different circumstances. Further, from the previous descriptions it will be understood how the probe member tip might be changed in certain circumstances. For example, for the three-component probe depicted in FIG. 6, the barrel and probe member assembly could be removed and replaced by an alternate assembly having a different tip. If a two-component probe were mounted as shown in FIGS. 3, 4 and 5, the probe could be dismounted from the holder mechanism and replaced by a two-component probe having a different tip.

It will be understood that a variety of dimensions of components for the contact probe depicted in FIG. 6 may be utilized for different circumstances. However, it is foreseen that such a probe may be particularly preferred when centers to be tested are positioned approximately 0.050 inches apart, and when the spring stroke is to be approximately 0.250 inches. Under such circumstances, the overall width of the head portion of the probe member, at its widest point, is preferably about 0.029 inches, with a diameter of the shaft portion being approximately 0.0165 inches. The length of the probe member, without including the foot portion, is approximately 0.797 inches, with the foot portion adding approximately 0.025 inches to the overall length. The barrel and cylinder member are sized appropriately.

For use in such a device, it is foreseen that a spring providing a rated spring force of about 3.0 ounces will be preferred. Preferably, the barrel will have been constructed from gold lined nickel silver, the spring being made from gold plated music wire, and the plunger from hardened steel, gold plated over nickel. The receptacle or cylinder member will generally be a gold lined nickel/silver item.

It is noted that, for the preferred embodiments described and shown, the mounting flares were shown on a very end, or tip, of the cylinder members. It is foreseen that in some applications a mounting flare could be positioned on the cylinder member spaced from the very end of the cylinder member. With such an arrangement, the three methods of mounting could be practiced, however the apertures in the cap members would need to be sized accordingly. Generally, flares on the end of the cylinder members will be preferred, for example for ease of construction and handling.

It is further noted that while certain dimensions and compositions have been provided herein for preferred constructions of spring-loaded contact probes, the invented concepts disclosed herein may be applied to contact probes of a variety of manufactures. Further, it will be understood that while certain embodiments of the present invention have been illustrated and described, it not to be limited to the specific forms or arrangement of parts herein described and shown.

What is claimed and desired to be secured by Letters Patent is as follows:

1. A test fixture and spring probe assembly comprising:
    (a) a test fixture having first and second outer plate members and a central locking plate mounted therebetween, and including means for variably laterally adjusting said locking plate relative to said outer plate member, said test fixture having aligned bores through said outer plate members and locking plate;
    (b) a probe assembly having an elongate cylindrical barrel with first and second ends, with said second end including means for connection to an electrical conductor; a probe shaft extensible from said barrel first end and terminating in a probe contact tip; and spring means urging said probe shaft outwardly of said barrel; and
    (c) said probe assembly being mounted in said test fixture by insertion through said aligned bores so that said outer plate members are generally positioned adjacent said barrel first and second ends and with said locking plate adjusted in slight lateral misalignment to engage and press against a portion of said barrel positioned in said test fixture between said outer plate members, thereby retaining said probe assembly in said test fixture.

2. A test fixture and spring probe assembly comprising:
  (a) a test fixture having a bore extending therein;
  (b) a spring probe assembly insertable into said test fixture bore and including an elongate cylindrical barrel with first and second ends, means for connection of said probe assembly to an electrical conductor, a spring probe shaft mounted in and extensible from said barrel, spring means urging said probe shaft outwardly through said barrel first end, a probe shaft tip for contact electrical engagement, and with said barrel first end having a flared configuration of conical, tapered funnel shape expanding radially outwardly from said first end for self centering and wedging said barrel in a friction fit in said test fixture bore; and
  (c) a test fixture cap member having a bore sized for extension of said probe shaft therethrough and positioned outward of said barrel flared first end so as to trap said first end between said cap member and said test fixture; and means connecting said cap member to said test fixture, thereby retaining said spring probe assembly mounted therein.

3. An electrical contact testing spring probe for insertion in a test fixture and comprising:
  (a) an elongate, cylindrical barrel having first and second ends, with said second end including means for connection to said electrical conductor;
  (b) a flared configuration of conical, tapered funnel shape expanding radially outwardly from said first end for self centering and wedging said barrel in a friction fit in a mounting hole in a test fixture; and
  (c) a spring probe mounted in said barrel, including: a probe shaft having a diameter to slidably engage an inside diameter of said barrel, a probe tip extensible from said barrel, a foot end trapped in said barrel and joined to said probe shaft by a shaft portion of lesser diameter than said foot end and said probe shaft; and a coil spring received within said barrel and extending between a first detent in said barrel and said foot end with said foot end restrained in said barrel by a second detent in said barrel; said flared first end of said barrel providing a funnel for assembly insertion of said spring probe into said barrel.

4. An electrical contact testing spring probe for insertion in a test fixture and comprising:
  (a) an elongate, cylindrical barrel having first and second ends, with said second end including means for connection to an electrical conductor;
  (b) a probe assembly inserted into said receptacle and including:
    (i) a cylindrical barrel inserted within said receptacle and having an open end and a closed end so that said barrel open end is spaced inwardly of said receptacle first end with said receptacle extending axially beyond said barrel;
    (ii) a probe shaft extensibly protruding from said barrel and having: a plunger shaft protruding from said receptacle first end and terminating in a contact tip; said plunger shaft being of a diameter substantially the same as the inside diameter of said receptacle for secure, sliding travel therethrough; a shaft head at an opposite termination of said plunger shaft and means trapping said shaft head within said barrel; and a reduced diameter portion of said probe shaft extending outwardly of said barrel open end and joined to said plunger shaft;
    (iii) a spring received within said barrel and extending between said probe shaft head and said barrel closed end and urging said probe shaft outwardly;
  (c) whereby said plunger shaft is slidably support by said receptacle for pointing accuracy.

* * * * *

UNITED STATES PATENT AND TRADEMARK OFFICE
CERTIFICATE OF CORRECTION

PATENT NO. : 4,783,624

DATED : November 8, 1988

INVENTOR(S) : Eugene R. Sabin

It is certified that error appears in the above-identified patent and that said Letters Patent are hereby corrected as shown below:

In the Claims, column 22, Claim 4, lines 12-14 should appear as follows:

(a)   an elongate, cylindrical receptacle having first and second ends, with said second end including means for connection to an electrical conductor;

Signed and Sealed this

Tenth Day of January, 1989

*Attest:*

DONALD J. QUIGG

*Attesting Officer*    *Commissioner of Patents and Trademarks*